United States Patent
Ho et al.

(10) Patent No.: US 10,037,927 B2
(45) Date of Patent: Jul. 31, 2018

(54) SEMICONDUCTOR STRUCTURE, TESTING AND FABRICATING METHOD THEREOF

(71) Applicant: TAIWAN SEMICONDUCTOR MANUFACTURING CO., LTD., Hsinchu (TW)

(72) Inventors: Yen-Hsung Ho, Taoyuan County (TW); Chia-Yi Tseng, Tainan (TW); Chih-Hsun Lin, Tainan (TW); Kun-Tsang Chuang, Miaoli County (TW); Yung-Lung Hsu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/588,585

(22) Filed: May 5, 2017

(65) Prior Publication Data
US 2018/0151459 A1    May 31, 2018

Related U.S. Application Data

(60) Provisional application No. 62/427,082, filed on Nov. 28, 2016.

(51) Int. Cl.
*H01L 21/66* (2006.01)
*H01L 21/768* (2006.01)

(52) U.S. Cl.
CPC ........ *H01L 22/32* (2013.01); *H01L 21/76807* (2013.01); *H01L 22/14* (2013.01)

(58) Field of Classification Search
CPC .................... H01L 22/14; H01L 22/32
USPC ................................ 438/17, 462; 257/48
See application file for complete search history.

(56) References Cited

U.S. PATENT DOCUMENTS

| | | | | |
|---|---|---|---|---|
| 2002/0145442 A1* | 10/2002 | Kinoshita | ............... | H01L 22/34 324/750.3 |
| 2003/0006795 A1* | 1/2003 | Asayama | ................ | H01L 22/34 324/750.3 |
| 2006/0006328 A1* | 1/2006 | Cao | ....................... | G01N 23/225 250/310 |
| 2008/0164468 A1* | 7/2008 | Chen | ..................... | H01L 23/585 257/48 |
| 2008/0308800 A1* | 12/2008 | Otsuki | .................... | H01L 22/14 257/48 |
| 2009/0050885 A1* | 2/2009 | Cho | ........................ | H01L 21/78 257/48 |
| 2009/0243645 A1* | 10/2009 | Shinkawata | ........ | G01R 31/2884 324/750.16 |
| 2013/0130415 A1* | 5/2013 | Ahn | ........................ | H01L 22/14 438/18 |
| 2015/0113343 A1* | 4/2015 | Lee | ..................... | G01R 31/2884 714/727 |
| 2016/0293507 A1* | 10/2016 | Shinkawata | ............ | H01L 22/34 |

* cited by examiner

*Primary Examiner* — George Fourson, III
(74) *Attorney, Agent, or Firm* — Maschoff Brennan

(57) ABSTRACT

A method of fabricating a semiconductor structure includes forming first and second features in a scribe region of a semiconductor substrate in which the first and second features are electrically isolated from each other; forming an interlayer dielectric layer over the first and second features; and forming a first contact in the interlayer dielectric layer and connected to the first feature and a second contact in the interlayer dielectric layer and connected to the second feature.

20 Claims, 8 Drawing Sheets

US 10,037,927 B2

SEMICONDUCTOR STRUCTURE, TESTING AND FABRICATING METHOD THEREOF

PRIORITY CLAIM AND CROSS-REFERENCE

This application claims priority to U.S. Provisional Application Ser. No. 62/427,082, filed Nov. 28, 2016, which is herein incorporated by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
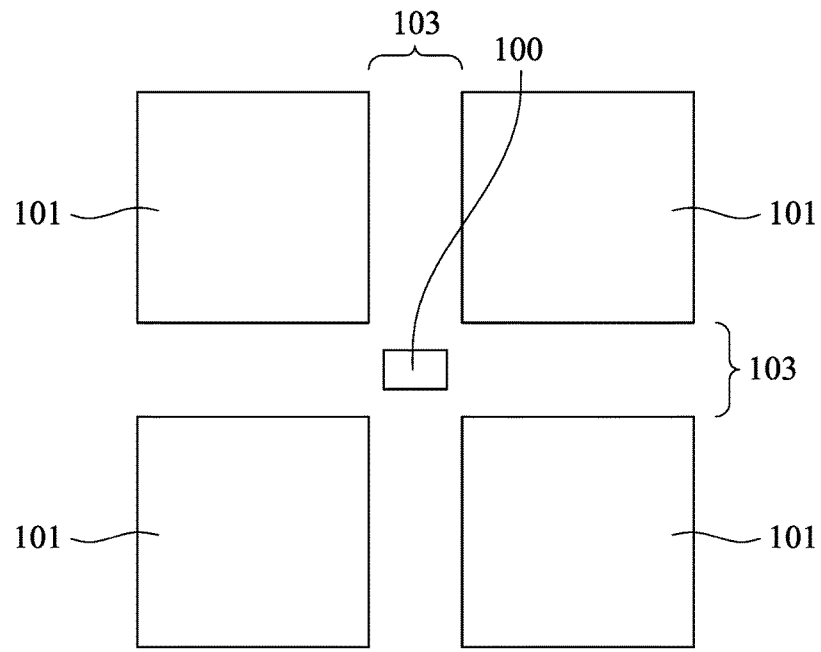
FIG. 1 is a plan view of dummy structure layouts in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a plan view of dummy structure layouts in accordance with some embodiments of the present disclosure. With reference to FIG. 1, there is shown some embodiments comprising a plurality of individual dies 101 on a wafer, wherein each die 101 includes a substrate (not shown) having electronic devices formed thereon. The substrate is covered with one or more dielectric layers and one or more metal layers (not shown) between adjacent dielectric layers. The metal layers provide connectivity and routing for the underlying electronic devices. There can be any number of alternating layers of metal layers and dielectric layers located on the die 101, but a range of layers would be from three layers to twelve layers of alternating metal layers and dielectric layers.

Separating the individual dies 101 are scribe lines 103, which form an area for a saw to be used to separate the die 101 from the wafer. The scribe lines 130 can be referred to as a scribe region. In some embodiments, scribe lines 103 run substantially parallel to the edges of the individual dies 101. Accordingly, the scribe lines 103 intersect each other at the corners of the dies 101 to form a junction region.

The scribe lines 103 are formed by not placing functional structures (structures that will be used by the die 101 once it has been cut from the wafer) into the area intended for the scribe line 103. Other structures, such as test pads or dummy metals used for planarization, could be placed into the scribe line 103, but would not be necessary for the functioning of the die 101 once the die 101 has been cut from the wafer. The scribe lines 103 may have a width of between about 20 µm and about 180 µm. Within the scribe lines 103 is placed at least one dummy structure 100.

Figure 2:
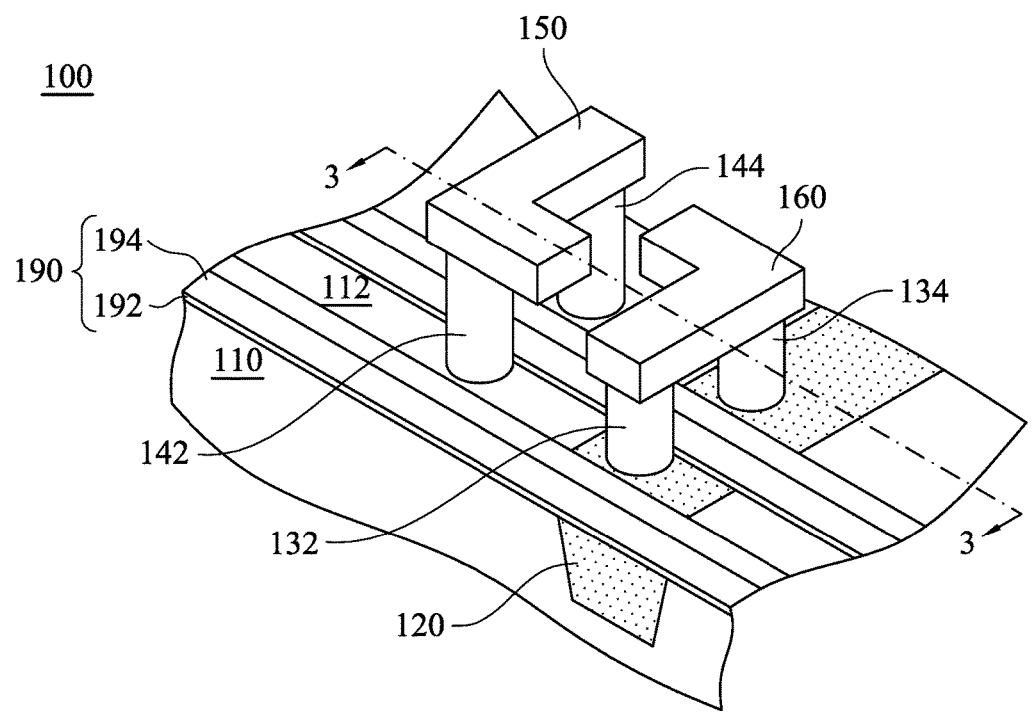
FIG. 2 is a perspective view of a dummy structure in accordance with some embodiments of the present disclosure.

FIG. 2 is a perspective view of a dummy structure 100 in accordance with some embodiments of the present disclosure. As shown in FIG. 2, the dummy structure 100 includes a substrate 110 and an isolation structure 120 in a trench of the substrate 110. The substrate 110 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 110 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 110 may be doped with a p-type dopant or an n-type dopant.

The isolation structure 120 in the trench of the substrate 110 may be a shallow trench isolation (STI) structure, and is referred to as an STI structure 120 hereinafter. The STI structure 120 includes a material such as silicon oxide, silicon nitride, silicon oxynitride, low-k materials, other suitable materials, or any combinations thereof. In some embodiments, an optional thermal oxide trench liner is grown to improve the trench interface.

The dummy structure 100 includes first contacts 142 and 144 on an active region (OD) 112 of the substrate 110, and second contacts 132 and 134 on the STI structure 120. For example, the first contacts 142 and 144 are in contact with the active region 112, and the second contacts 132 and 134 are in contact with the STI structure 120, and hence the first contacts 142 and 144 have electrical resistances different from electrical resistances of the second contacts 132 and 134. More particularly, the first contacts 142 and 144 are electrically isolated from the second contacts 132 and 134 at least by the STI structure 120. Such an electrical isolation between the first and second contacts may be advantageous to detect an unwanted electrical connection between the first and second contacts, and it will be discussed later.

The dummy structure 100 includes a conductive line 150 over the first contacts 142 and 144. The first contacts 142 and 144 are in contact with the conductive line 150, and hence the first contacts 142 and 144 can be electrically connected by the conductive line 150. Therefore, the conductive line 150 can be employed to apply a first voltage to the first contacts 142 and 144. Similarly, the dummy structure 100 includes a conductive line 160 over the second contacts 132 and 134. The second contacts 132 and 134 are in contact with the conductive line 160, and hence the second contacts 132 and 134 can be electrically connected by the conductive line 160. Therefore, the conductive line 160 can be employed to apply a second voltage to the second contacts 132 and 134. The first and second voltages are different so as to detect whether an unwanted electrical connection exists between the first and second contacts.

Figure 3:
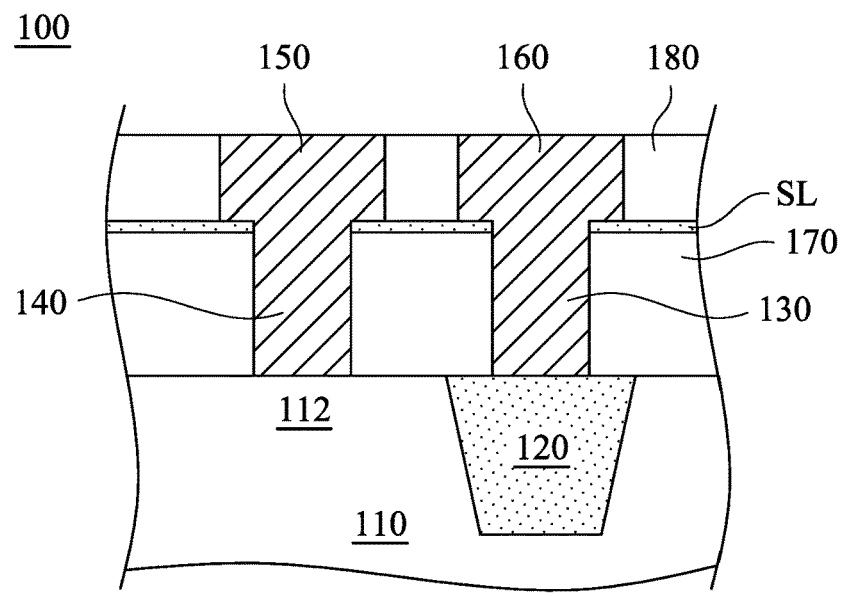
FIG. 3 is a cross-sectional view taken along line 3 in FIG. 2.
Figure 4:
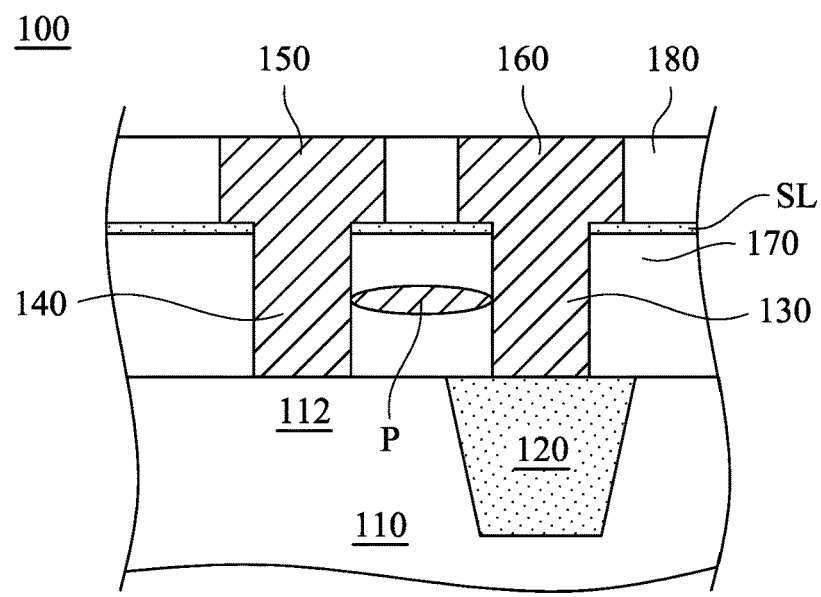
FIG. 4 is a cross-sectional view of a dummy structure with an unwanted electrical connection between contacts in accordance with some embodiments of the present disclosure.

For example, as illustrated in FIG. 3, which is a cross-sectional view taken along line 3 in FIG. 2, a first voltage can be applied through the conductive line 150 to the first contacts 140 (i.e. first contacts 142 and 144 in FIG. 2) on the active region 112, and a second voltage different from the first voltage can be applied through the conductive line 160 to the second contacts 130 on the STI structure 120. In the depicted embodiments where the first and second contacts 140 and 130 are free from unwanted electrical connections, the first and second contacts 140 and 130 can be electrically isolated by the STI structure 120. Therefore, when the first and second contacts 140 and 130 are applied with first and second voltages, no current occurs between the first and second contacts 140 and 130. On the other hand, as shown in FIG. 4, which illustrates an unwanted electrical connection P connected between the first and second contacts 140 and 130, the first and second contacts 140 and 130 are not electrically isolated due to the unwanted electrical connection P. Therefore, when the first and second contacts 140 and 130 are applied with first and second voltages different from each other, a current will occur between the first and second contacts 140 and 130. In other words, a short circuit will occur between the first and second contacts 140 and 130 due to the unwanted electrical connection P. As a result, the unwanted electrical connection P can be detected when the current is detected. In some embodiments, the first voltage is greater than the second voltage. In some other embodiments, the second voltage is greater than the first voltage.

In some embodiments, the unwanted electrical connection P may be a piping defect in an interlayer dielectric (ILD) layer 170 between the first and second contacts 140 and 130. More particularly, with reduced process size and increased integration, voids with piping shapes (not shown) easily form among gates due to the low filling capability of the ILD layer 170, and the voids may connect contact holes. As the contact holes are filled with a conductive material to form contacts, the conductive material fills the voids as well, and thus the conductive material in the voids forms the unwanted electrical connection P, which can be referred to as piping defects. Some contacts (e.g. first and second contacts 140 and 130 in FIG. 4) thus connect or short with each other due to the piping defects. During applying voltages to the first and second contacts 140 and 130, a current occurs between the first and second contacts 140 and 130 if the piping defect exists therebetween, and the piping defect can thus be detected based on the occurrence of current between the first and second contacts 140 and 130.

In some embodiments, the conductive line 150 is electrically isolated from the second contacts 130, so as to prevent an unwanted electrical connection between the first and second contacts 140 and 130. Similarly, the conductive line 160 is electrically isolated from the first contacts 140, so as to prevent an unwanted electrical connection between the first and second contacts 140 and 130.

In some embodiments, as shown in FIG. 2, gate structures 190 are over the active region 112. At least one gate structure 190 is between the first contacts 142 and 144, and hence portions of the active region 112 under the first contacts 142 and 144 can be doped as source/drain regions using an n type dopant or a p type dopant. Since the first contacts 142 and 144 landing on the source/drain regions are electrically connected to the same conductive line 150, the source/drain regions are electrically connected to each other, and hence the source/drain regions and the gate structure 190 therebetween may not act as a functional transistor. In some embodiments, the gate structure 190 extends over the STI structure 120 and is also between the second contacts 132 and 134. As a result, at least one first contact 140 and at least one second contact 130 are present between the gate structures 190, so as to detect the piping defect between the gate structures 190. In some embodiments, the gate structure 190 may include a stack of a gate dielectric layer 192 and a gate electrode 194, as illustrated in FIG. 2. Some elements, such as gate spacers on opposite sides of the gate structure 190 and ILD layers 170 over the substrate 110, are not illustrated in FIG. 2 for clarity.

In some embodiments, as shown in FIG. 3, an etch stop layer SL and another second ILD layer 180 is over the ILD layer 170, and the conductive lines 150 and 160 are embedded in the second ILD layer 180. The conductive lines 150, 160, the first contacts 140 and the second contacts 130 can be formed using, for example, a dual damascene process as shown in FIG. 5 to FIG. 9.

Figure 5:
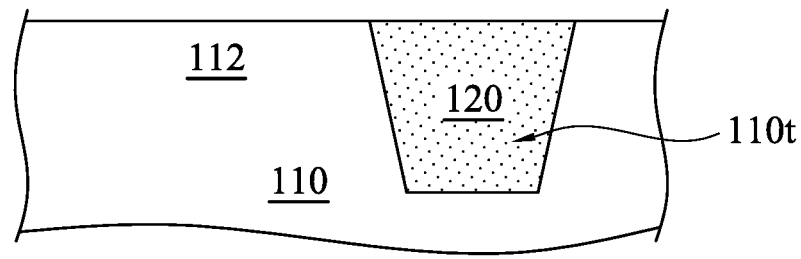
FIG. 5 to FIG. 9 illustrate a method for manufacturing a dummy structure at various stages in accordance with some embodiments of the present disclosure.

As shown in FIG. 5, the STI structure 120 is formed in the substrate 110, and the active region 112 is defined by the STI structure 120. In other words, the STI structure 120 abuts the active region 112. Formation of the STI structure 120 may include etching the substrate 110 to form a trench 110t, and filling the trench 110t with a dielectric material to form the STI structure 120. The STI structure 120 may be formed of silicon oxide deposited by a high density plasma, for example, although other dielectric materials formed according to various techniques may also be used. In some embodiments, a top surface of the active region 112 and a top surface of the STI structure 120 may be substantially level with each other, such as by performing a chemical mechanical polish (CMP) process after depositing the material of the STI structure 120, although the surfaces may be at slightly different levels.

Thereafter, one or more gate structures (not shown in this figure) may be formed over the active region 112, and source/drain regions can be formed in the active region 112 before or after the formation of the gate structures, for example, using a suitable technique, such as implant processes or combinations of epitaxy processes and implant processes.

Figure 6:
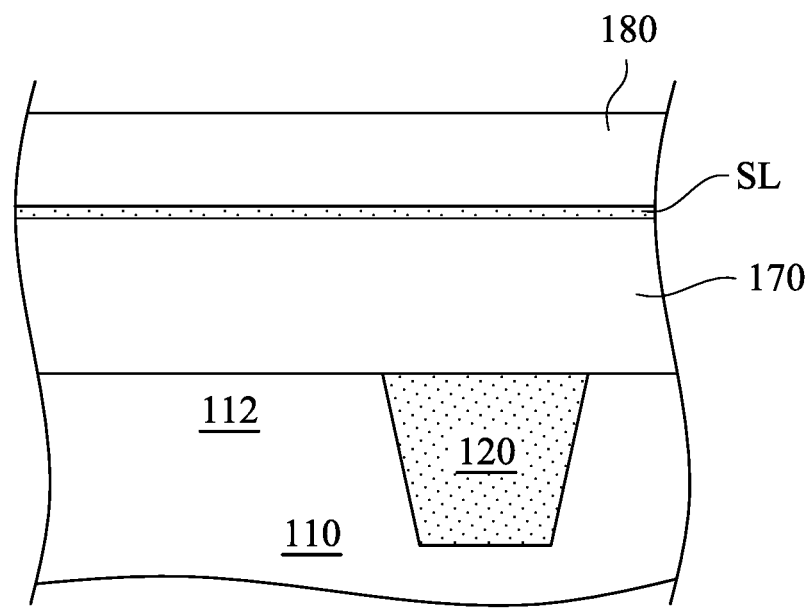

Next, as shown in FIG. 6, a first ILD layer 170 of a bilayer dielectric structure is deposited on the substrate 110. This may be followed by deposition of an etch stop layer SL on the first ILD layer 170. The process continues where a second ILD layer 180 of the bilayer dielectric structure is deposited, in a similar manner to first ILD layer 170, onto the etch stop layer SL. An antireflective layer (not shown) may be optionally deposited to the top of the second ILD layer 180. Portions of the first and second ILD layers 170 and 180 are then etched away where the interconnect lines and vias are to be formed, the antireflective layer may facilitate the photolithographic process used to form the etch patterns.

Figure 7:
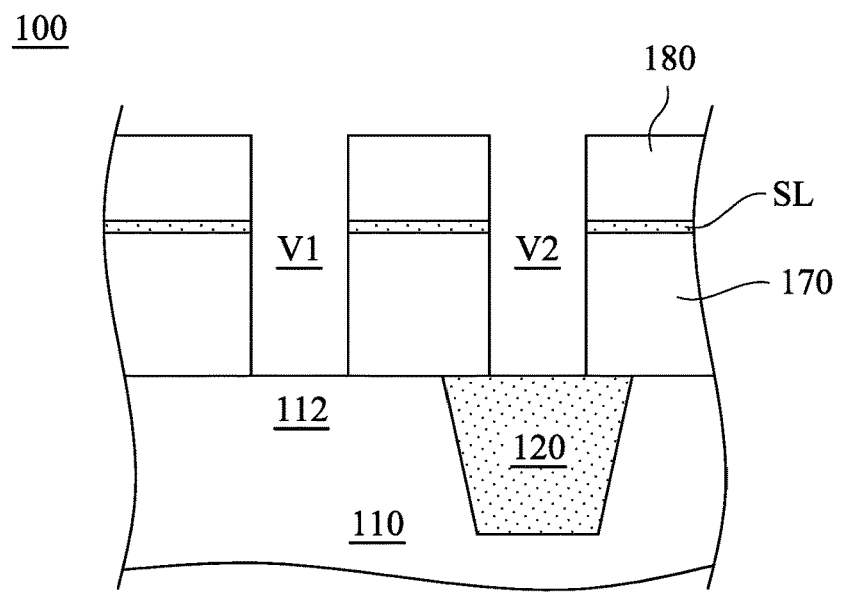

Continuing in FIG. 7, the bilayer dielectric structure is subjected to a photolithography and etching process to form openings for metal lines. In a "Via-First" approach, first photolithography and etching processing is applied on the bilayer dielectric structure, a photoresist is coated on the structure and lithographically exposed to form a pattern of vias. The pattern of vias is then developed in the photoresist, an anisotropic etching process is then applied to form via openings V1 and V2 in the bilayer dielectrics. The etching etches through the second and first ILD layers 180 and 170, and stops on the substrate 110. More particularly, the etching of the via opening V1 stops on the active region 112, and the etching of the via opening V2 stops on the STI structure 120, and hence the active region 112 and the STI structure 120 are respectively exposed at bottoms of the via openings V1 and V2.

Figure 8:
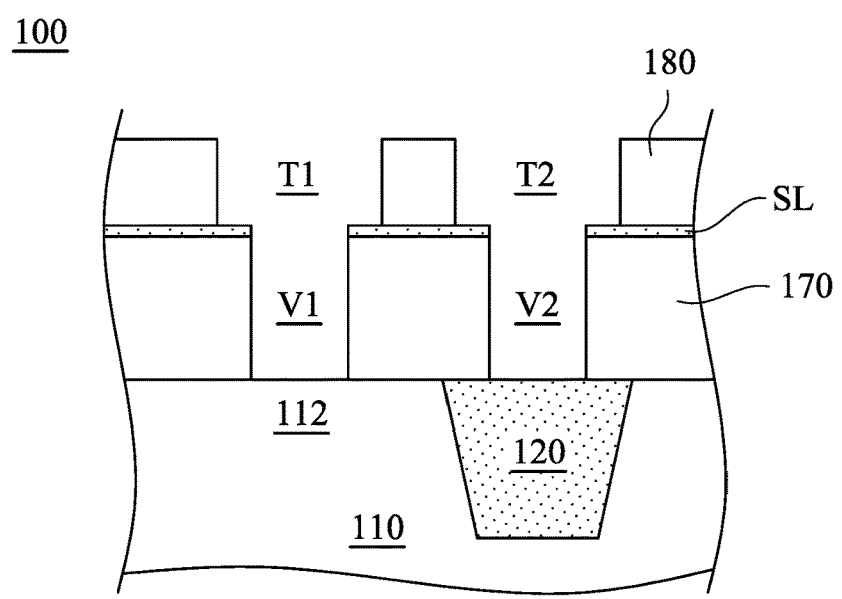

As shown in FIG. 8, second photolithography and etching processing is subsequently applied on the bilayer dielectric structure; the structure is coated with a photoresist and lithographically exposed to form a pattern of trenches. The pattern of trenches is then developed in the photoresist, an anisotropic etching process is then applied to cut trench openings T1 and T2. In some embodiments where the etch stop layer SL is present between the first and second ILD layers 170 and 180, the etching of trench openings T1 and T2 can be controlled to stop on the etch stop layer SL. As a result, trench openings T1 and T2 are etched in the second ILD layer 180, and are connected to the previously formed via openings V1 and V2, respectively. More particularly, the via opening V1 is between the trench opening T1 and the active region 112, and the via opening V2 is between the trench opening T2 and the STI structure 120.

Figure 9:
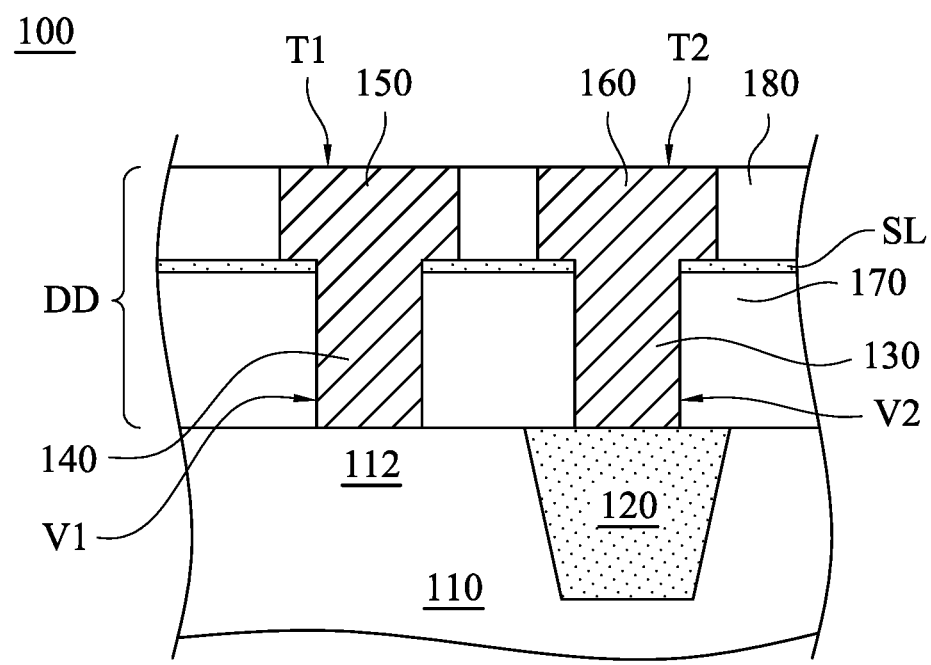

As illustrated in FIG. 9, via and trench openings V1, V2 and T1, T2 are then filled with conductor utilizing suitable deposition processes, such as chemical vapor deposition (CVD), plasma-assisted CVD, sputtering, electroplating, or the like, to form a dual damascene structure DD over the substrate 110. The dual damascene structure DD is then planarized to remove excess conductor from its top surface and to provide a substantially flat surface for the subsequent processing steps. The dual damascene structure DD includes first and second contacts 140 and 130 respectively in the via openings V1 and V2, and conductive lines 150 and 160 respectively in the trench openings T1 and T2. Since the active region 112 and the STI structure 120 are respectively exposed at bottoms of the via openings V1 and V2, the first and second contacts 140 and 130 can be in contact with the active region 112 and the STI structure 120, respectively.

In some alternative embodiments, via and trench openings V1, V2 and T1, T2 may also be formed through a "Trench-First" approach, where trench openings T1 and T2 are patterned and etched through first photolithography and etching processing, while via openings V1 and V2 are patterned and etched through second photolithography and etching processing, among other similar processing steps.

Figure 10:
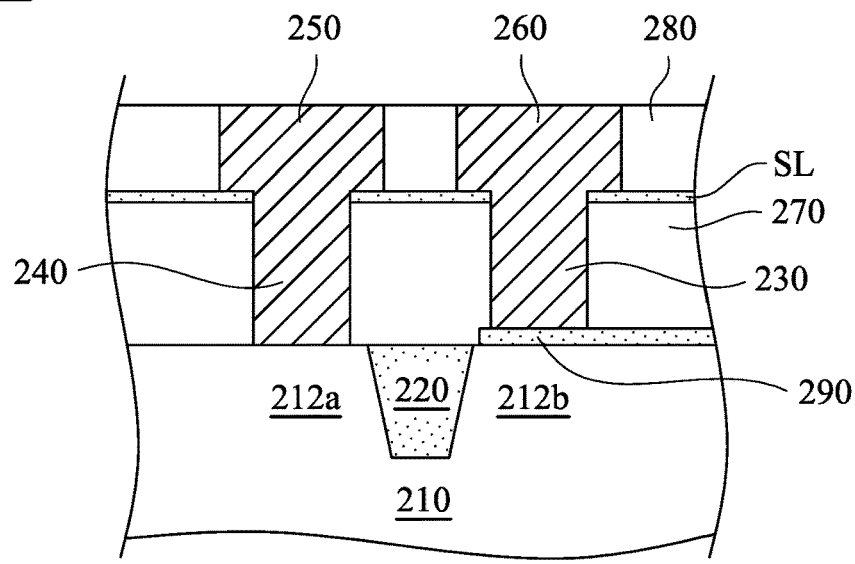
FIG. 10 is a cross-sectional view of a dummy structure in accordance with some embodiments of the present disclosure.

FIG. 10 is a cross-sectional view of a dummy structure 200 in accordance with some embodiments of the present disclosure. As shown in FIG. 10, the dummy structure 200 includes a substrate 210 and an isolation structure 220 in a trench of the substrate 210. The isolation structure 220 is between active regions 212a and 212b of the substrate 210. In other words, the active regions 212a and 212b are separated by the STI structure 220. The substrate 210 may comprise a semiconductor material as discussed previously. The isolation structure 220 may be an STI structure 220 and may comprise a dielectric material as discussed previously. The dummy structure 200 further includes a dielectric structure 290 formed over the active region 212b of the substrate 210. The dielectric structure 290 may be a resist protective oxide (RPO), and is referred to as an RPO structure 290 hereinafter. The RPO structure 290 is deposited over substrate 210 and then selectively removed where silicidation is desired. The RPO structure 290 will prevent silicidation where it remains over the substrate 210.

The dummy structure 200 includes first contacts 240 on the active region 212a of the substrate 210, and second contacts 230 on the RPO structure 290. For example, the first contacts 240 are in contact with the active region 212a, and the second contacts 230 are in contact with the RPO structure 290, and hence the first contacts 240 may have electrical resistances different from electrical resistances of the second contacts 230. More particularly, the first contacts 240 are electrically isolated from the second contacts 230 at least by the RPO structure 290. Such an electrical isolation between the first and second contacts 240 and 230 may be advantageous to detect an unwanted electrical connection between the first and second contacts 240 and 230.

The dummy structure 200 includes a conductive line 250 over the first contacts 240, and a conductive line 260 over the second contacts 230. The first contacts 240 are electrically connected by the conductive line 250, and the second contacts 230 are electrically connected by the conductive line 260. Therefore, the conductive line 250 can be employed to apply a first voltage to the first contacts 240, and the conductive line 260 can be employed to apply a second voltage to the second contacts 230. The first and second voltages are different so as to detect whether an unwanted electrical connection exists between the first and second contacts 240 and 230.

Figure 11:
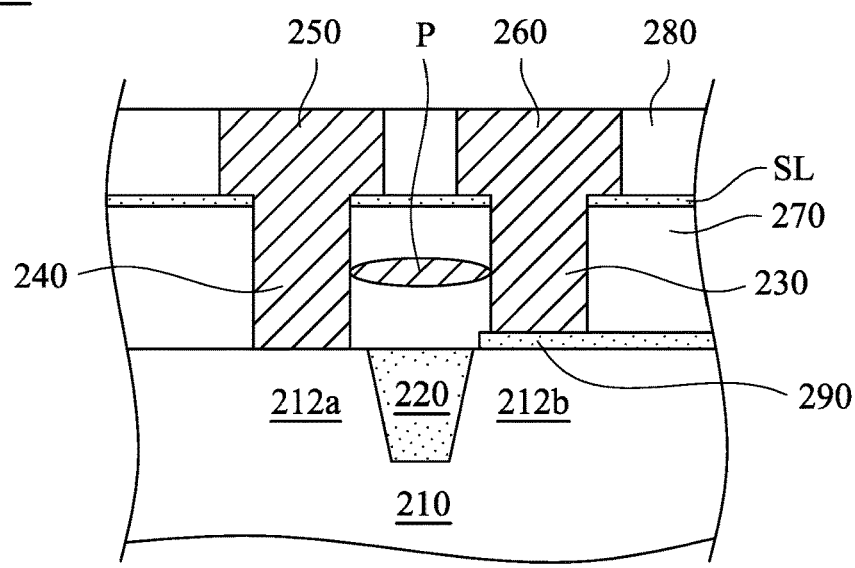
FIG. 11 is a cross-sectional view of a dummy structure with an unwanted electrical connection between contacts in accordance with some embodiments of the present disclosure.

For example, in the depicted embodiments where the first and second contacts 240 and 230 are free from unwanted electrical connections (e.g. piping defects), the first and second contacts 240 and 230 can be electrically isolated at least by the RPO structure 290. Therefore, when the first and second contacts 240 and 230 are applied with first and second voltages, no current occurs between the first and second contacts 240 and 230. On the other hand, as shown in FIG. 11, which illustrates an unwanted electrical connection P (e.g. a piping defect) connected between the first and second contacts 240 and 230, the first and second contacts 240 and 230 are not electrically isolated due to the unwanted electrical connection P. Therefore, when the first and second contacts 240 and 230 are applied with first and second voltages different from each other, a current will occur between the first and second contacts 240 and 230. As a result, the unwanted electrical connection P can be detected when the current is detected. Formation of ILD layers 270, 280, the first and second contacts 240, 230, and the conductive lines 250 and 260 may comprise a dual damascene process, for example, as shown in FIGS. 6-9.

Figure 12:
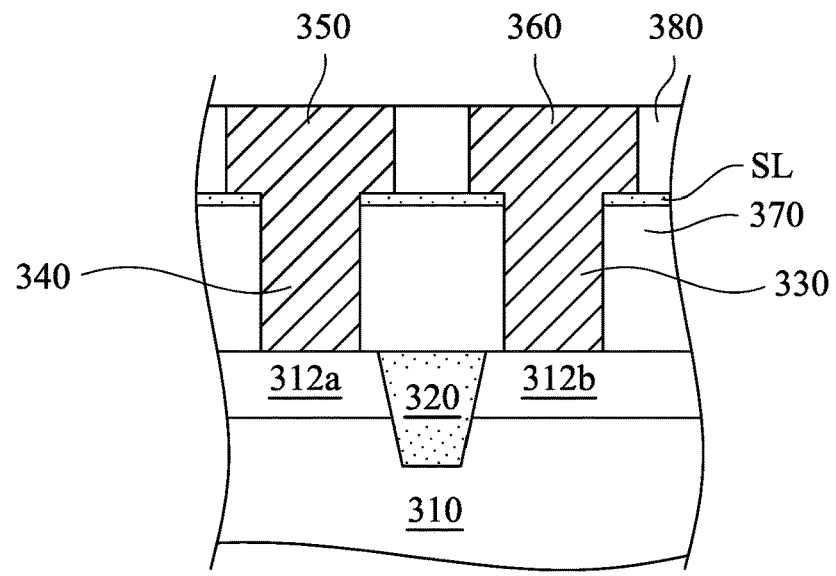
FIG. 12 is a cross-sectional view of a dummy structure in accordance with some embodiments of the present disclosure.

FIG. 12 is a cross-sectional view of a dummy structure 300 in accordance with some embodiments of the present disclosure. As shown in FIG. 12, the dummy structure 300 includes a substrate 310 and an isolation structure 320 in a trench of the substrate 310. The substrate 310 may comprise a semiconductor material as discussed previously. The isolation structure 320 may be an STI structure 320 and may comprise a dielectric material as discussed previously. The dummy structure 300 further includes first and second doped active regions 312a and 312b formed in the substrate 310 using implant processes. The first and second doped regions 312a and 312b are doped with different types of impurities (or dopants). For example, the first doped region 312a can be doped with a p-type impurity, such as boron or $BF_2$, and the second doped region 312b can be doped with an n-type impurity, such as phosphorus or arsenic, and vice versa.

The dummy structure 300 includes first contacts 340 on the first doped region 312a, and second contacts 330 on the second doped region 312b. For example, the first contacts 340 are in contact with the first doped region 312a, and the second contacts 330 are in contact with the second doped region 312b, and hence the first contacts 340 may have electrical properties different from electrical properties of the second contacts 330. More particularly, a conductive path will not be created between the first and second doped regions 312a and 312b doped with different types of impurities when they are applied with voltages. As a result, the first and second contacts 340 and 330 respectively landing on the first and second doped regions 312a and 312b are electrically isolated. Such an electrical isolation between the first and second contacts 340 and 330 may be advantageous to detect an unwanted electrical connection between the first and second contacts 340 and 330.

The dummy structure 300 includes a conductive line 350 over the first contacts 340, and a conductive line 360 over the second contacts 330. The first contacts 340 are electrically connected by the conductive line 350, and the second contacts 330 are electrically connected by the conductive line 360. Therefore, the conductive line 350 can be employed to apply a first voltage to the first contacts 340, and the conductive line 360 can be employed to apply a second voltage to the second contacts 330. The first and second voltages are different so as to detect whether an unwanted electrical connection exists between the first and second contacts 340 and 330.

Figure 13:
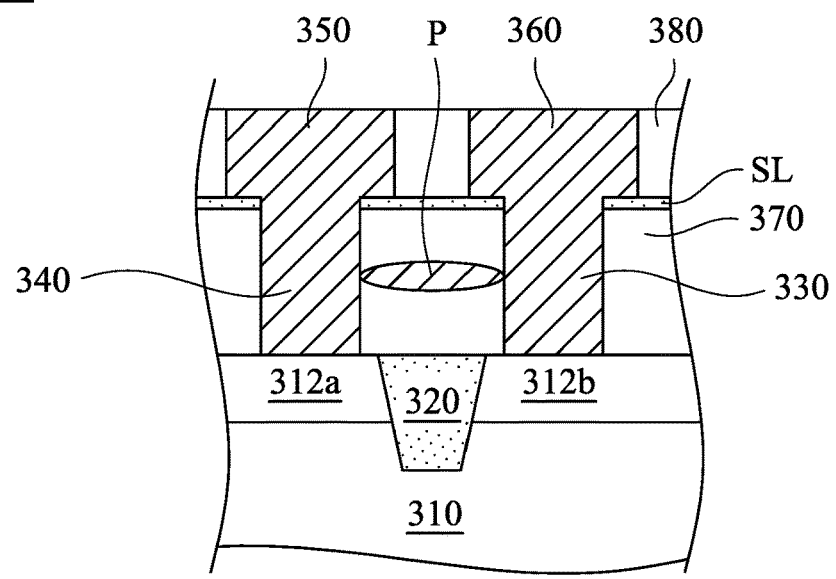
FIG. 13 is a cross-sectional view of a dummy structure with an unwanted electrical connection between contacts in accordance with some embodiments of the present disclosure.

For example, in the depicted embodiments where the first and second contacts 340 and 330 are free from unwanted electrical connections (e.g. piping defects), the first and second contacts 340 and 330 can be electrically isolated due to the electrical isolation between the first and second doped regions 312a and 312b. Therefore, when the first and second contacts 340 and 330 are applied with first and second voltages, no current occurs between the first and second contacts 340 and 330. On the other hand, as shown in FIG. 13, which illustrates an unwanted electrical connection P (e.g. a piping defect) connected between the first and second contacts 340 and 330, the first and second contacts 340 and 330 are not electrically isolated due to the existence of the unwanted electrical connection P. Therefore, when the first and second contacts 340 and 330 are applied with first and second voltages different from each other, a current will occur between the first and second contacts 340 and 330. As a result, the unwanted electrical connection P can be detected when the current is detected. Formation of ILD layers 370, 380, the first and second contacts 340, 330, and the conductive lines 350 and 360 may comprise a dual damascene process, for example, as shown in FIGS. 6-9.

Figure 14:
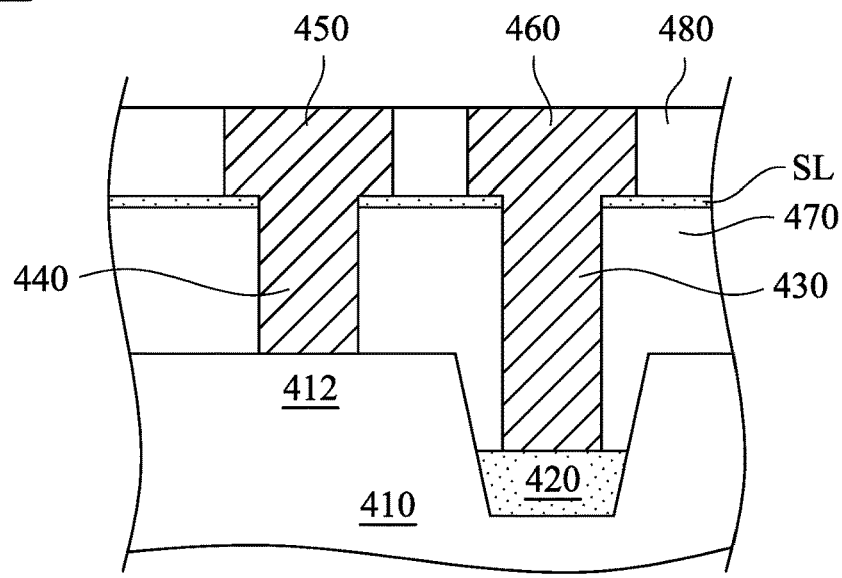
FIG. 14 is a cross-sectional view of a dummy structure in accordance with some embodiments of the present disclosure.

FIG. 14 is a cross-sectional view of a dummy structure 400 in accordance with some embodiments of the present disclosure. As shown in FIG. 14, the dummy structure 400 includes a substrate 410 and an isolation structure 420 in a trench of the substrate 410. The substrate 410 may comprise a semiconductor material as discussed previously. The isolation structure 420 may be referred to as an STI structure 420 and may comprise a dielectric material as discussed previously. The STI structure 420 has a top surface in a position lower than a top surface of the active region 412 of the substrate 410, and hence the active region 412 can be formed as a fin-shaped structure protruding from the top surface of the STI structure 420, and hence the active region 412 can be referred to as a semiconductor fin 412 hereinafter.

The dummy structure 400 includes first contacts 440 on the semiconductor fin 412 of the substrate 210, and second contacts 430 on the STI structure 420. For example, the first contacts 440 are in contact with the semiconductor fin 412, and the second contacts 430 are in contact with the STI structure 420, and hence the first contacts 440 may have electrical resistances different from electrical resistances of the second contacts 430. More particularly, the first contacts 440 are electrically isolated from the second contacts 430 at least by the STI structure 420. Such an electrical isolation between the first and second contacts 440 and 430 may be advantageous to detect an unwanted electrical connection between the first and second contacts 440 and 430. As depicted, the top surface of the semiconductor fin 412 is in a position higher than the top surface of the top surface of the STI structure 420, and hence bottom ends of the first contacts 440 are in positions higher than bottom ends of the second contacts 430.

The dummy structure 400 includes a conductive line 450 over the first contacts 440, and a conductive line 460 over the second contacts 430. The first contacts 440 are electrically connected by the conductive line 450, and the second contacts 430 are electrically connected by the conductive line 460. Therefore, the conductive line 450 can be employed to apply a first voltage to the first contacts 440, and the conductive line 460 can be employed to apply a second voltage to the second contacts 430. The first and second voltages are different so as to detect whether an unwanted electrical connection exists between the first and second contacts 440 and 430.

Figure 15:
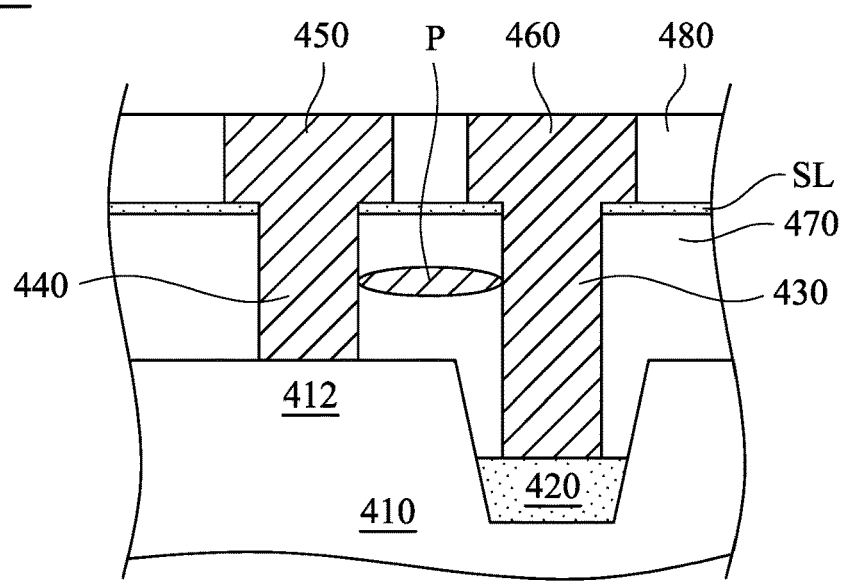
FIG. 15 is a cross-sectional view of a dummy structure with an unwanted electrical connection between contacts in accordance with some embodiments of the present disclosure.

For example, in the depicted embodiments where the first and second contacts 440 and 430 are free from unwanted electrical connections (e.g. piping defects), the first and second contacts 440 and 430 can be electrically isolated at least by the STI structure 420. Therefore, when the first and second contacts 440 and 430 are applied with first and second voltages, no current occurs between the first and second contacts 440 and 430. On the other hand, as shown in FIG. 15, which illustrates an unwanted electrical connection P (e.g. a piping defect) connected between the first and second contacts 440 and 430, the first and second contacts 440 and 430 are not electrically isolated due to the unwanted electrical connection P. Therefore, when the first and second contacts 440 and 430 are applied with first and second voltages different from each other, a current will occur between the first and second contacts 440 and 430. As a result, the unwanted electrical connection P can be detected when the current is detected. Formation of ILD layers 470, 480, the first and second contacts 440, 430, and the conductive lines 450 and 460 may comprise a dual damascene process, as examples.

Embodiments of the present disclosure allow contacts of the dummy structure to land on regions having different electrical properties. The electrical property difference may be advantageous to electrically isolate the contacts if there is no unwanted electrical connection (e.g. piping defect) between the contacts. Therefore, when the contacts are applied with different voltages, no current occurs between the contacts. On the other hand, if there is an unwanted electrical connection (e.g. piping defect) between the contacts, a current occurs between the contacts when they are applied with different voltages. Therefore, existence of the unwanted electrical connection between contacts can be determined based on whether a current occurs between the contacts when the contacts are applied with different voltages.

According to some embodiments, a method of fabricating a semiconductor structure includes forming first and second features in a scribe region of a semiconductor substrate, wherein the first and second features are electrically isolated from each other, forming an interlayer dielectric layer over the first and second features, and forming a first contact in the interlayer dielectric layer and connected to the first feature and a second contact in the interlayer dielectric layer and connected to the second feature.

According to some embodiments, a method of fabricating a semiconductor structure includes forming first and second features on a semiconductor substrate, wherein the first and second features are electrically isolated from each other, forming an interlayer dielectric layer over the first and second features, forming a first contact in the interlayer dielectric layer and connected to the first feature and a second contact in the interlayer dielectric layer and connected to the second feature, and detecting if a short circuit occurs between the first contact and the second contact.

According to some embodiments, a semiconductor structure includes a semiconductor substrate, a first feature, a second feature, a first contact and a second contact. The semiconductor substrate includes a scribe region. The first feature is in the scribe region. The second feature is in the scribe region. The first feature and the second feature are electrically isolated from each other. The first contact is on the first feature. The second contact is on the second feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, the method comprising:
   forming first and second features in a scribe region of a semiconductor substrate, wherein the first and second features are electrically isolated from each other;
   forming an interlayer dielectric layer over the first and second features; and
   forming in the interlayer dielectric layer a first contact connected to the first feature, a second contact connected to the second feature, a third contact connected to the first feature, and a fourth contact connected to the second feature.

2. The method of claim 1, wherein the forming the first and second features comprises:
   forming an isolation structure in the semiconductor substrate as the second feature, wherein the isolation structure defines an active region as the first feature.

3. The method of claim 1, further comprising:
   forming a conductive line connecting the first contact and the third contact.

4. The method of claim 1, further comprising:
   forming a gate structure at least on the first feature and between the first and third contacts.

5. The method of claim 1, further comprising:
   forming a conductive line connecting the second contact and the fourth contact.

6. The method of claim 1, wherein the forming the first and second features comprises:
   forming an isolation structure in the semiconductor substrate to separate a first active region and a second active region, wherein the first active region is the first feature; and
   forming a dielectric layer over the second active region as the second feature.

7. The method of claim 1, wherein the forming the first and second features comprises:
   doping a first dopant into the semiconductor substrate to form a first active region as the first feature; and
   doping a second dopant into the semiconductor substrate to form a second active region as the second feature, wherein the first dopant and the second dopant are different.

8. A method of fabricating a semiconductor structure, the method comprising:
   forming first and second features on a semiconductor substrate, wherein the first and second features are electrically isolated from each other;
   forming an interlayer dielectric layer over the first and second features;
   forming in the interlayer dielectric layer a first contact connected to the first feature and a second contact connected to the second feature; and
   detecting if a short circuit occurs between the first contact and the second contact, wherein the detecting comprises:
   applying a first voltage to the first contact;

applying a second voltage to the second contact, wherein the first voltage is different from the second voltage; and detecting if a current occurs between the first contact and the second contact.

9. The method of claim 8, further comprising:
forming a first conductive line connected to the first contact.

10. The method of claim 8, further comprising:
forming a second conductive line connected to the second contact.

11. The method of claim 8, wherein the first and second features are formed in a scribe region between first and second dies on the semiconductor substrate.

12. A semiconductor structure, comprising:
a semiconductor substrate comprising a scribe region;
a first feature in the scribe region;
a second feature in the scribe region, wherein the first feature and the second feature are electrically isolated from each other;
a first contact and a gate structure on the first feature;
a second contact on the second feature;
a third contact on the first feature, wherein the gate structure is between the first contact and the third contact; and
a conductive line connecting the first contact and the third contact.

13. The semiconductor structure of claim 12, wherein the first feature is an active region.

14. The semiconductor structure of claim 12, wherein the second feature comprises a dielectric material.

15. The semiconductor structure of claim 12, wherein the first feature is an n-type doped region, and the second feature is a p-type doped region.

16. The method of claim 1, wherein forming the second feature comprises forming an isolation structure such that a top surface of the isolation structure is lower than a top surface of the first feature.

17. The method of claim 8, further comprising forming a third contact and a gate structure between the first and third contacts.

18. The method of claim 8, further comprising:
forming an isolation structure in the semiconductor substrate as the second feature; and
forming an active region in the semiconductor substrate as the first feature.

19. The method of claim 8, further comprising:
doping the first feature with a first dopant to form a first active region; and
doping the second feature with a second dopant to form a second active region.

20. The method of claim 8, wherein forming the second feature comprises forming an isolation structure such that a top surface of the isolation structure is lower than a top surface of the first feature.

* * * * *